US011199505B2

(12) United States Patent
Chao et al.

(10) Patent No.: US 11,199,505 B2
(45) Date of Patent: Dec. 14, 2021

(54) MACHINE LEARNING ENHANCED OPTICAL-BASED SCREENING FOR IN-LINE WAFER TESTING

(71) Applicant: INTERNATIONAL BUSINESS MACHINES CORPORATION, Armonk, NY (US)

(72) Inventors: Robin Hsin Kuo Chao, Cohoes, NY (US); Mary Breton, Troy, NY (US); Huai Huang, Saratoga, NY (US); Dexin Kong, Guilderland, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 16/110,048

(22) Filed: Aug. 23, 2018

(65) Prior Publication Data

US 2020/0064275 A1    Feb. 27, 2020

(51) Int. Cl.
| | |
|---|---|
| *G01N 21/95* | (2006.01) |
| *G01N 21/47* | (2006.01) |
| *G06N 5/02* | (2006.01) |
| *G06N 20/00* | (2019.01) |

(52) U.S. Cl.
CPC ......... *G01N 21/9501* (2013.01); *G01N 21/47* (2013.01); *G06N 5/02* (2013.01); *G06N 20/00* (2019.01); *G01N 2201/126* (2013.01)

(58) Field of Classification Search
CPC .............. G01N 21/9501; G01N 21/47; G01N 2201/126; G06N 20/00; G06N 5/02
See application file for complete search history.

(56) References Cited

U.S. PATENT DOCUMENTS

| | | | | |
|---|---|---|---|---|
| 6,028,664 | A | * | 2/2000 | Cheng ................ G01N 21/9501 356/237.4 |
| 6,751,519 | B1 | | 6/2004 | Satya et al. |
| 6,773,939 | B1 | * | 8/2004 | Wright .................. B24B 37/042 438/16 |
| 7,111,257 | B2 | | 9/2006 | Robson et al. |
| 7,220,605 | B1 | * | 5/2007 | Cadouri .................. H01L 22/20 257/E21.521 |
| 7,453,584 | B2 | | 11/2008 | Li et al. |

(Continued)

OTHER PUBLICATIONS

Larry Hardesty ,"Explained :Neural Network", Apr. 14, 2017 (Year: 2017).*

(Continued)

*Primary Examiner* — Catherine T. Rastovski
*Assistant Examiner* — Aeysha N Sultana
(74) *Attorney, Agent, or Firm* — Tutunjian & Bitetto, P.C.; Randall Bluestone

(57) ABSTRACT

A method for machine learning enhanced optical-based screening for in-line wafer testing includes receiving optical spectra data for a wafer-under-test by performing scatterometry on the wafer-under-test, performing predictive model screening by applying a predictive model based on the optical spectra data, determining whether a device associated with the wafer-under-test is defective based on the predictive model screening, and if the device is determined to be defective, dynamically modifying a yield map associated with the wafer-under-test, including reassigning at least one die.

18 Claims, 7 Drawing Sheets

(56) References Cited

U.S. PATENT DOCUMENTS

| | | | |
|---|---|---|---|
| 7,495,254 | B2 | 2/2009 | Fales et al. |
| 8,627,266 | B2 | 1/2014 | Lee et al. |
| 9,607,265 | B2 | 3/2017 | Jin et al. |
| 2004/0210413 | A1* | 10/2004 | Dorough ............ G01R 31/2894 702/117 |
| 2017/0109646 | A1* | 4/2017 | David ................ G03F 7/70633 |
| 2017/0178980 | A1* | 6/2017 | Owen .................... H01L 22/10 |
| 2017/0287751 | A1 | 10/2017 | Kuznetsov et al. |

OTHER PUBLICATIONS

Hyeoun-Ae, "An Introduction to Logistic Regression : From Basic Concepts to Interpretation with Particular Attention to Nursing Domain", Apr. 2013 (Year: 2013).*

Hyeoun, "An Introduction to Logistic regression: From Basic Concepts to Interpretation with Particular attention to Nursing domain", Apr. 2013 (Year: 2013).*

Larry Hardesty,"Explained: Neural Network ", Apr. 14, 2017, p. 2—"Weighty matters", Line 1-4 (Year: 2017).*

Hardesty, L. (2017). Explained: neural networks. MIT News. Saatavissa: https://news.mit.edu/2017/explained-neural-networks-deeplearning-0414. Hakupäivä, 19, 2020. (Year: 2017).*

Hyeoun-Ae. 'An Introduction to Logistic Regression : From Basic Concepts to Interpretation with Particular Attention to Nursing Domain'. Apr. 2013 (Year: 2013) (Year: 2013).*

Orji, "International Roadmap for Devices and Systems 2017 Edition Metrology", IEEE Advancing Technology for Humanity, Apr. 2018, 61 pages.

Breton, "Electrical Test Prediction Using Hybrid Metrology and Machine Learning", SPIE Advanced Lithography, vol. 10145, Apr. 2017, 9 pages.

Rana, "Leveraging Advanced Data Analytics, Machine Learning, and Metrology Models to Enable Critical Dimension Metrology Solutions for Advanced Integrated Circuit Nodes", Journal of Micro/Nanolithography, MEMS, and MOEMS, vol. 13, Issue 4, Dec. 2014, 10 pages.

Timoney, "Implementation of Machine Learning for High-Volume Manufacturing Metrology Challenges", SPIE Advanced Lithography, Mar. 2018, 9 pages.

\* cited by examiner

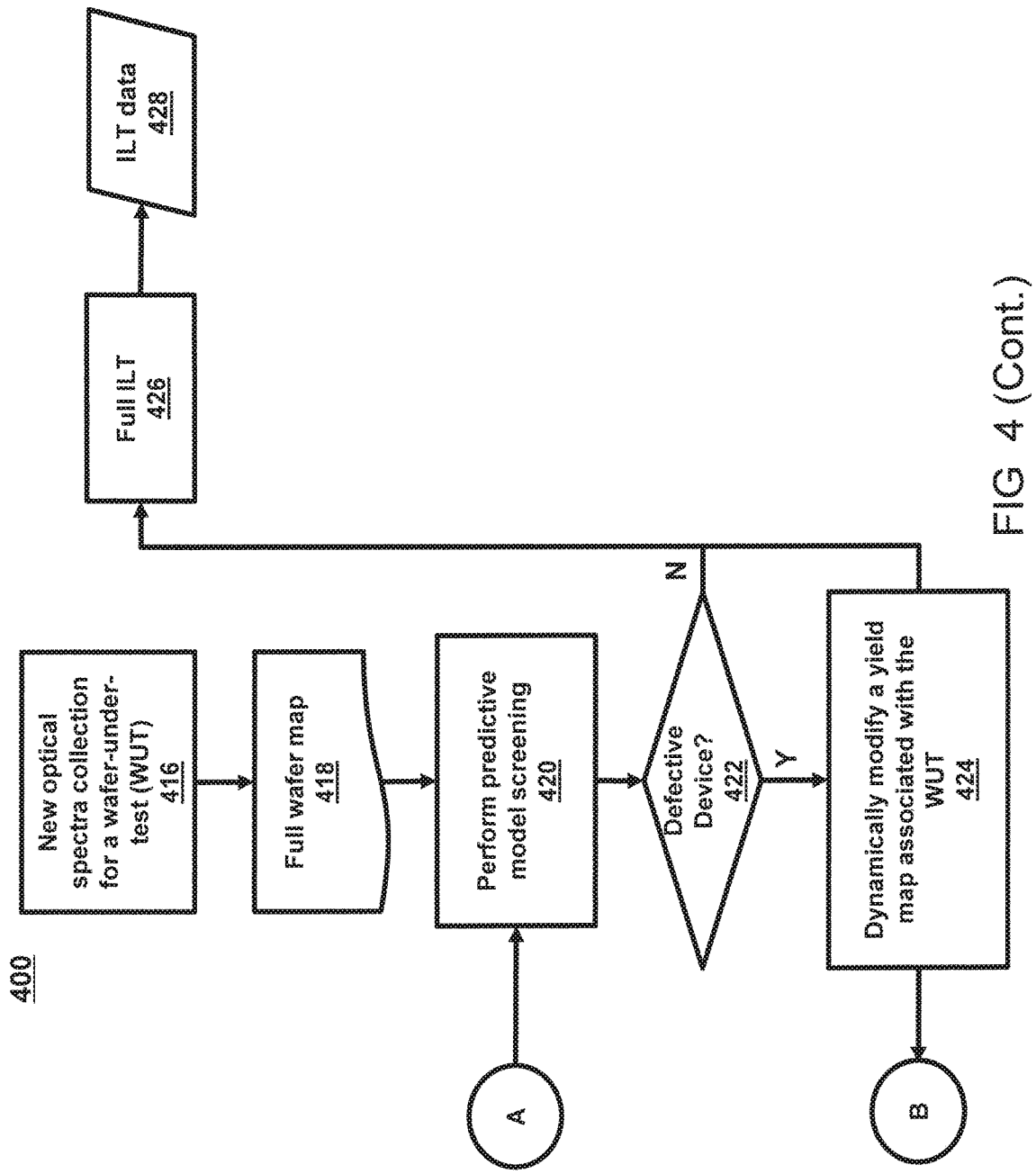

MACHINE LEARNING ENHANCED OPTICAL-BASED SCREENING FOR IN-LINE WAFER TESTING

BACKGROUND

Technical Field

The present invention generally relates to machine learning, and more particularly to machine learning enhanced optical-based screening for in-line wafer testing.

Description of the Related Art

Wafer testing is a step performed during semiconductor device fabrication and processing, which can be performed prior to the wafer being sent for die preparation. During the wafer testing step, electronics devices, such as, e.g., integrated circuits that are present on the wafer are tested for functional defects by applying special test patterns to them.

SUMMARY

In accordance with an embodiment of the present invention, a computer-implemented method for machine learning enhanced optical-based screening for in-line wafer testing is provided. The method includes receiving optical spectra data for a wafer-under-test by performing scatterometry on the wafer-under-test, performing predictive model screening by applying a predictive model based on the optical spectra data, determining whether a device associated with the wafer-under-test is defective based on the predictive model screening, and if the device is determined to be defective, dynamically modifying a yield map associated with the wafer-under-test, including reassigning at least one die to at least one next die with a similar distance from a center of the wafer-under-test.

In accordance with another embodiment of the present invention, a system for machine learning enhanced optical-based screening for in-line wafer testing is provided. The system includes a memory device for storing program code and at least one processor operatively coupled to the memory device. The at least one processor is configured to execute program code stored on the memory device to receive optical spectra data for a wafer-under-test by performing scatterometry on the wafer-under-test, perform predictive model screening by applying a predictive model based on the optical spectra data, determine whether a device associated with the wafer-under-test is defective based on the predictive model screening, and if the device is determined to be defective, dynamically modify a yield map associated with the wafer-under-test by reassigning at least one die to at least one next die with a similar distance from a center of the wafer-under-test.

In accordance with yet another embodiment of the present invention, a computer program product is provided. The computer program product includes a non-transitory computer readable storage medium having program code embodied therewith. The program code are executable by a computer to cause the computer to perform a method for machine learning enhanced optical-based screening for in-line wafer testing. The method performed by the computer includes receiving optical spectra data for a wafer-under-test by performing scatterometry on the wafer-under-test, performing predictive model screening by applying a predictive model based on the optical spectra data, determining whether a device associated with the wafer-under-test is defective based on the predictive model screening, and if the device is determined to be defective, dynamically modifying a yield map associated with the wafer-under-test, including reassigning at least one die to at least one next die with a similar distance from a center of the wafer-under-test.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Current in-line testing (ILT) maps for wafer testing can be fixed and predetermined via, e.g., autosite algorithms, which can select dies based on macro positions on the wafer. With eighteen (18) dies, a full ILT process per wafer can take over an hour due to multiple sweep conditions, macros to test, etc. However, at the development cycle where the yield is not optimized, it is commonly observed that the data is contaminated with defective devices.

The embodiments described herein provide for systems and methods for in-line wafer testing using machine learning enhanced optical metrology to measure and characterize wafer structures, thereby improving wafer testing efficiency and reducing or eliminating bias results due to predetermined die maps. The embodiments described herein can solve various problems related to wafer testing, including wrong wafer testing statistics caused by static sampling regardless of wafer variation, by providing an effective fast screening process to control the sampling yielding and not yielding devices. For example, wafer sampling can be dynamically adjusted prior to the testing by employing a cognitive screening process. The cognitive screening process employing machine learning techniques can classify a chip as "good" or "defective" prior to testing, and an associated dynamic die selection process can be employed to reduce or eliminate bias with improved statistics. The embodiments described herein can provide for a high throughput (e.g., about 15 minutes for full wafer measurement) and non-destructive in-line metrology technique that has good precision (e.g., is sensitive to change in structure). The embodiments described herein can illustratively use a broadband light source such as, e.g., deep-ultraviolet to near-infrared (DUV-NIR), which can be sensitive to buried features and material properties.

Figure 1:
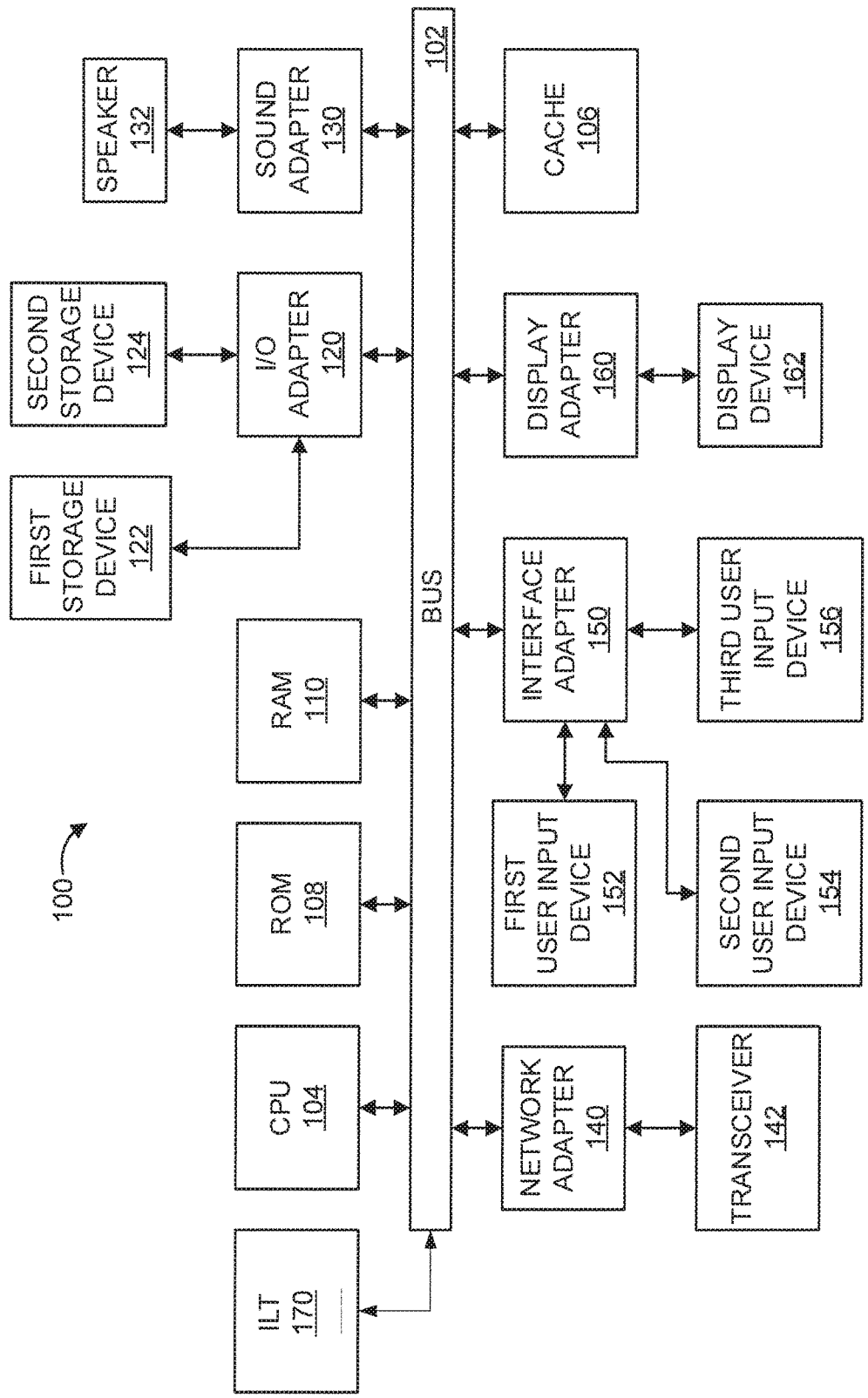
FIG. 1 is a block diagram of a processing system, in accordance with an embodiment of the present invention.

Referring now to the drawings in which like numerals represent the same or similar elements and initially to FIG. 1, an exemplary processing system 100 to which the present invention may be applied is shown in accordance with one embodiment. The processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 100.

ILT component 170 may be operatively coupled to system bus 102. ILT component 170 is configured to perform one or more of the operations described below with reference to FIGS. 4-6. ILT component 170 can be implemented as a standalone special purpose hardware device, or may be implemented as software stored on a storage device. In the embodiment in which ILT component 170 is software-implemented, although the anomaly detector is shown as a separate component of the computer system 100, ILT component 170 can be stored on, e.g., the first storage device 122 and/or the second storage device 124. Alternatively, ILT component 170 can be stored on a separate storage device (not shown).

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 2:
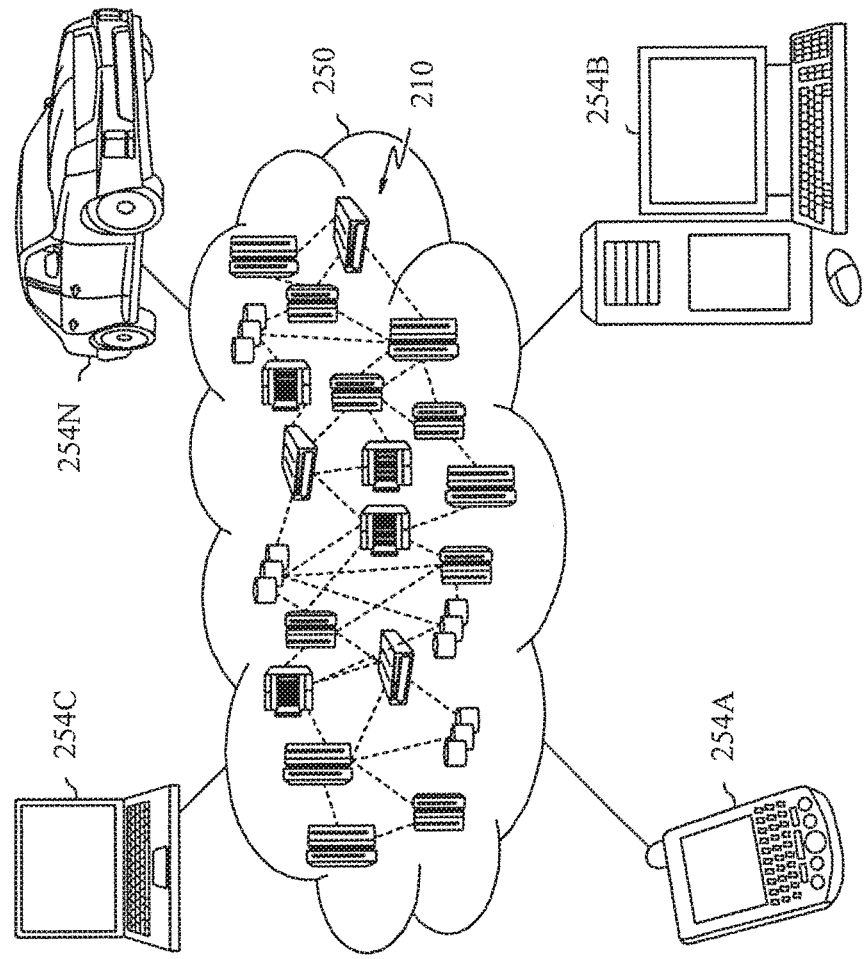
FIG. 2 is a block diagram showing an illustrative cloud computing environment having one or more cloud computing nodes with which local computing devices used by cloud consumers communicate, in accordance with an embodiment of the present invention.

Referring now to FIG. 2, illustrative cloud computing environment 250 is depicted. As shown, cloud computing environment 250 includes one or more cloud computing nodes 210 with which local computing devices used by cloud consumers, such as, for example, personal digital assistant (PDA) or cellular telephone 254A, desktop computer 254B, laptop computer 254C, and/or automobile computer system 254N may communicate. Nodes 210 may communicate with one another. They may be grouped (not shown) physically or virtually, in one or more networks, such as Private, Community, Public, or Hybrid clouds as described hereinabove, or a combination thereof. This allows cloud computing environment 250 to offer infrastructure, platforms and/or software as services for which a cloud consumer does not need to maintain resources on a local computing device. It is understood that the types of computing devices 254A-N shown in FIG. 2 are intended to be illustrative only and that computing nodes 210 and cloud computing environment 250 can communicate with any type of computerized device over any type of network and/or network addressable connection (e.g., using a web browser).

Figure 3:
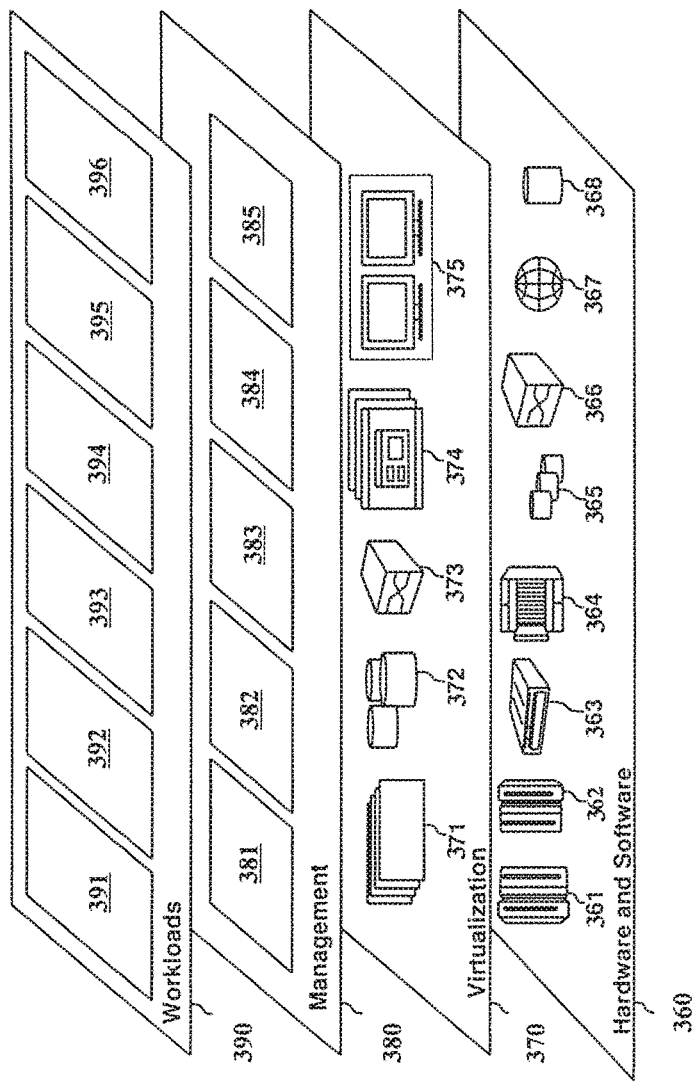
FIG. 3 is a block diagram showing a set of functional abstraction layers provided by a cloud computing environment, in accordance with an embodiment of the present invention.

Referring now to FIG. 3, a set of functional abstraction layers provided by cloud computing environment 250 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 360 includes hardware and software components. Examples of hardware components include: mainframes 361; RISC (Reduced Instruction Set Computer) architecture based servers 362; servers 363; blade servers 364; storage devices 365; and networks and networking components 366. In some embodiments, software components include network application server software 367 and database software 368.

Virtualization layer 370 provides an abstraction layer from which the following examples of virtual entities may be provided: virtual servers 371; virtual storage 372; virtual networks 373, including virtual private networks; virtual applications and operating systems 374; and virtual clients 375.

In one example, management layer 380 may provide the functions described below. Resource provisioning 381 provides dynamic procurement of computing resources and other resources that are utilized to perform tasks within the cloud computing environment. Metering and Pricing 382 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 383 provides access to the cloud computing environment for consumers and system administrators. Service level management 384 provides cloud computing resource allocation and management such that required service levels are met. Service Level Agreement (SLA) planning and fulfillment 385 provide pre-arrangement for, and procurement of, cloud computing resources for which a future requirement is anticipated in accordance with an SLA.

Workloads layer 390 provides examples of functionality for which the cloud computing environment may be utilized. Examples of workloads and functions which may be provided from this layer include: mapping and navigation 391; software development and lifecycle management 392; virtual classroom education delivery 393; data analytics processing 394; transaction processing 395; and ILT screening 396.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 4:
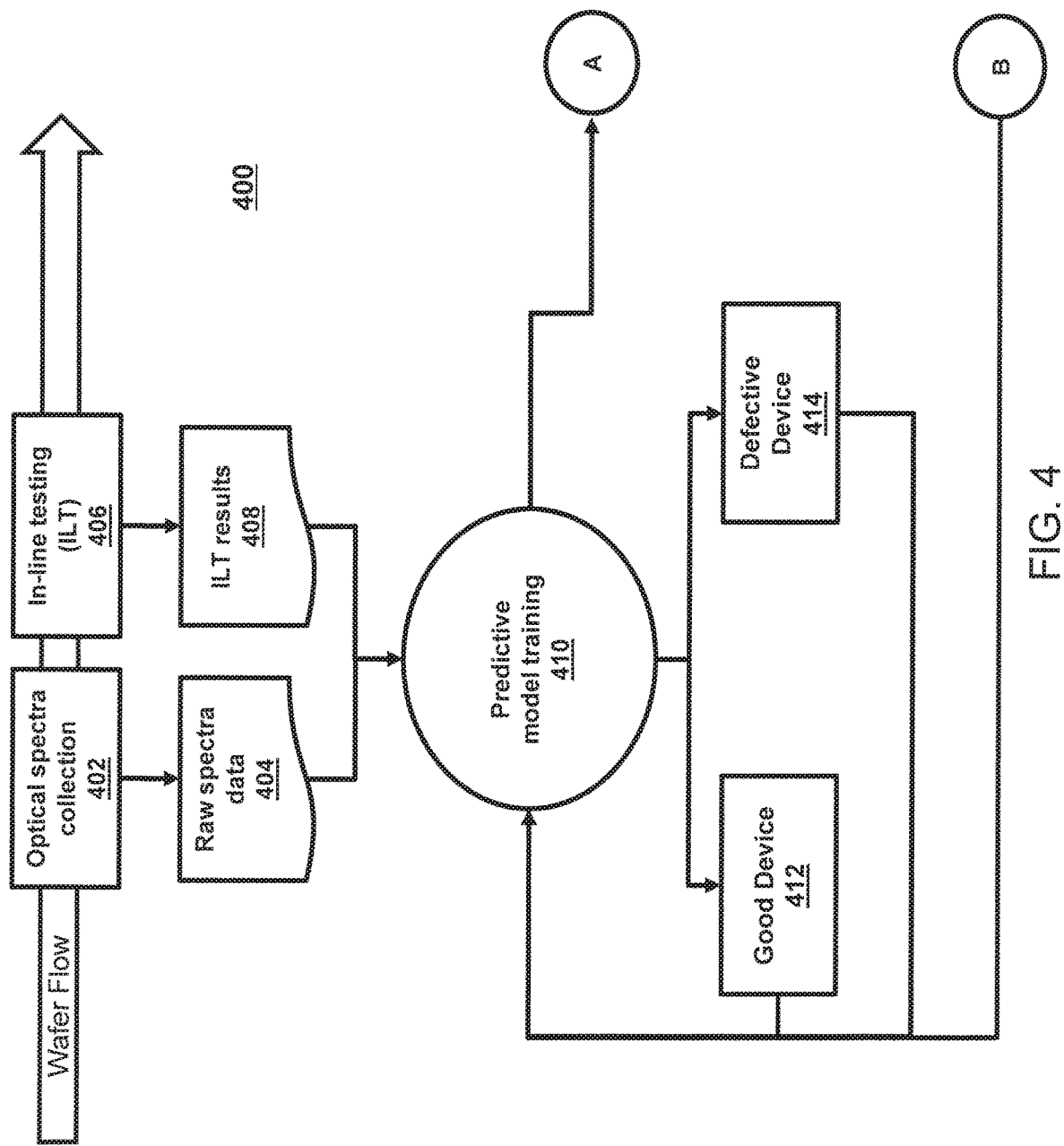
FIG. 4 is a block/flow diagram of a system/method for machine learning enhanced optical-based screening for in-line wafer testing, in accordance with an embodiment of the present invention.

With reference to FIG. 4, a block/flow diagram is provided illustrating a system/method 400 for machine learning enhanced optical-based screening for in-line wafer testing.

At block 402, optical spectra data is collected to generate raw spectra data at block 404. The optical spectra data can be collected at block 402 via scatterometry.

Generally, in the field of metrology, scatterometry is an optical critical dimension (OCD) technology that operates by emitting electromagnetic waves onto a sample, and measuring changes in one or more properties of the electromagnetic waves (e.g., light waves, radio waves) that are scattered by diffusion from the sample using one or more hardware components or tools. More specifically, an intensity (I) of the diffracted electromagnetic waves can be measured as a function of at least one of the angle of incidence, angle of diffraction and/or wavelength ($\lambda$). Results of the scatterometry can produce experiment data corresponding to the sample (e.g., a signature), which can illustratively be compared to a library or store of signatures to characterize the sample. Examples of scatterometry tools that can be used include, but are not limited to, scatterometers, reflectometers, ellipsometers, goniometers, etc.

Scatterometry is capable of measuring buried structures in a non-invasive or non-destructive manner. Moreover, since scatterometry is not based on image analysis techniques, modeling can be needed to determine parameters of a structure for describing the sample. For example, software can be used to analyze the optical spectra data collected at block 402 to generate the raw spectra data at block 404. The raw spectra data generated at block 404 can include data relating to, e.g., intensity (I) versus wavelength ($\lambda$). In accordance with the embodiments described herein, scatterometry can be used to determine the dimensions on a wafer that control the resulting performance of a device.

At block 406, in-line testing (ILT) is performed to generate ILT results at block 408. Any suitable ILT technique can be used in accordance with the embodiments described herein. In one embodiment, the ILT results generated at block 408 can include results related to resistance and/or capacitance.

The raw spectra data generated at block 404 can be associated with the ILT results generated at block 408 in order to categorize whether a device is "good" or "defective." A "defective" device is a device having a physical anomaly or error resulting from the fabrication process that can cause a device malfunction. A device is considered to be "good" if it is not defective. The fraction or percentage of "good" devices produced during the device fabrication process, relative to the total number of devices produced during the device fabrication process ("good" devices and "defective" devices), is referred to as the "yield."

At block 410, predictive model training can be performed based on a training set of data including the raw spectra data 404 and the ILT results 408 to obtain a predictive model for categorizing a device into a "good" or "yielding" class at block 412, or "defective" or "non-yielding" class at block 414. That is, the predictive model training performed at block 410 can be used to link the raw spectra data generated at block 404 with the ILT results generated at block 408.

Any suitable machine learning technique can be used to obtain the predictive model for categorizing a good device or a defective device. For example, since there are two device classifications ("good and "defective"), a binary or two-class classification algorithm can be used to obtain the predictive model. In one embodiment, the two-class classification algorithm includes a two-class logistic regression to obtain a predictive model including a logistic regression model. For example, without loss of generality, "defective" can be represented by "0" and "good" can be represented by "1". The predictive model can then be trained by finding the a combination of model parameters that produces the "best" model.

Blocks 402-414 have described the model training portion of the system/method 400 for machine learning enhanced optical-based screening for in-line wafer testing. As will be now be described, the predictive model can be used to screen a wafer-under-test (WUT) to determine whether or not a full ILT process should be performed on the WUT.

At block 416, new optical spectra data is collected to generate a full wafer map at block 418 for the WUT. The optical spectra data corresponding to the WUT can be collected at block 416 via scatterometry, as described above with reference to blocks 402 and 404. Similar to the raw spectra data generated at block 404, the full wafer map generated at block 418 can include data relating to, e.g., intensity (I) versus wavelength ($\lambda$).

At block 420, predictive model screening is performed. The predictive model screening can be performed by applying the predictive model to the full wafer map generated at block 418 to obtain a yield map with a confidence level for screening of each device under test (DUT). The screening of given one of the DUTs can be performed by obtaining scatterometry spectra data from a die corresponding to the given DUT, and feeding the scatterometry spectra data as input into the trained machine learning model to classify the given DUT as a "good" or "defective" device.

At block 422, for each DUT, it is determined whether the DUT in each die corresponds to a "defective" device based on the predictive model.

If a given one of the DUTs in a given die is determined to correspond to a "defective" device based on the predictive model at block 422, the yield map associated with the WUT is dynamically modified associated with the wafer-under-test at block 424.

In one embodiment, dynamically modifying the yield map at block 424 can include reassigning at least one die. For example, the at least one die can be reassigned to a next die with a similar distance from the center of the WUT. The re-assignment is performed to avoid misleading analysis due to the fixed sampling location with no prior knowledge of the device quality. With a full prior knowledge of device yield from the screening process described, the yield map can be dynamically changed. Accordingly, the ILT map can be modified dynamically.

At least one of a plurality of re-assignment options can be selected at block 424. In one embodiment, the at least one re-assignment option implemented at block 424 can be manually selected by a user. In another embodiment, the at least one re-assignment option can be set as a default option. The default option in this embodiment can then be manually changed by a user, if desired.

Examples of re-assignment options that can be used to dynamically modify the yield map at block 424 include, but are not limited to: (1) clean data (100% yielding device); (2) 80% yielding device with 20% defective device learning; and (3) resemble wafer yield map. Option (1) allows a user to learn yielding device performance without the impurity of bad data. Option (2) provides a user information regarding both device performance from the "good" devices and the failure mechanism(s) from the "defective" devices. Option (3) reflects the real yield map with the best device selected from the screening.

If the DUT is determined to not correspond to a "defective" device based on the predictive model, or after the re-assignment performed at block 424, a full ILT can be performed at block 426 to produce ILT data 428.

Whether or not a DUT is determined to be "good" or "defective," the results of this analysis can be fed back into the predictive model training at block 410 to further train and update the predictive model. Thus, the predictive model can be improved with each new test based on the new raw spectra data that is generated.

Figure 5:
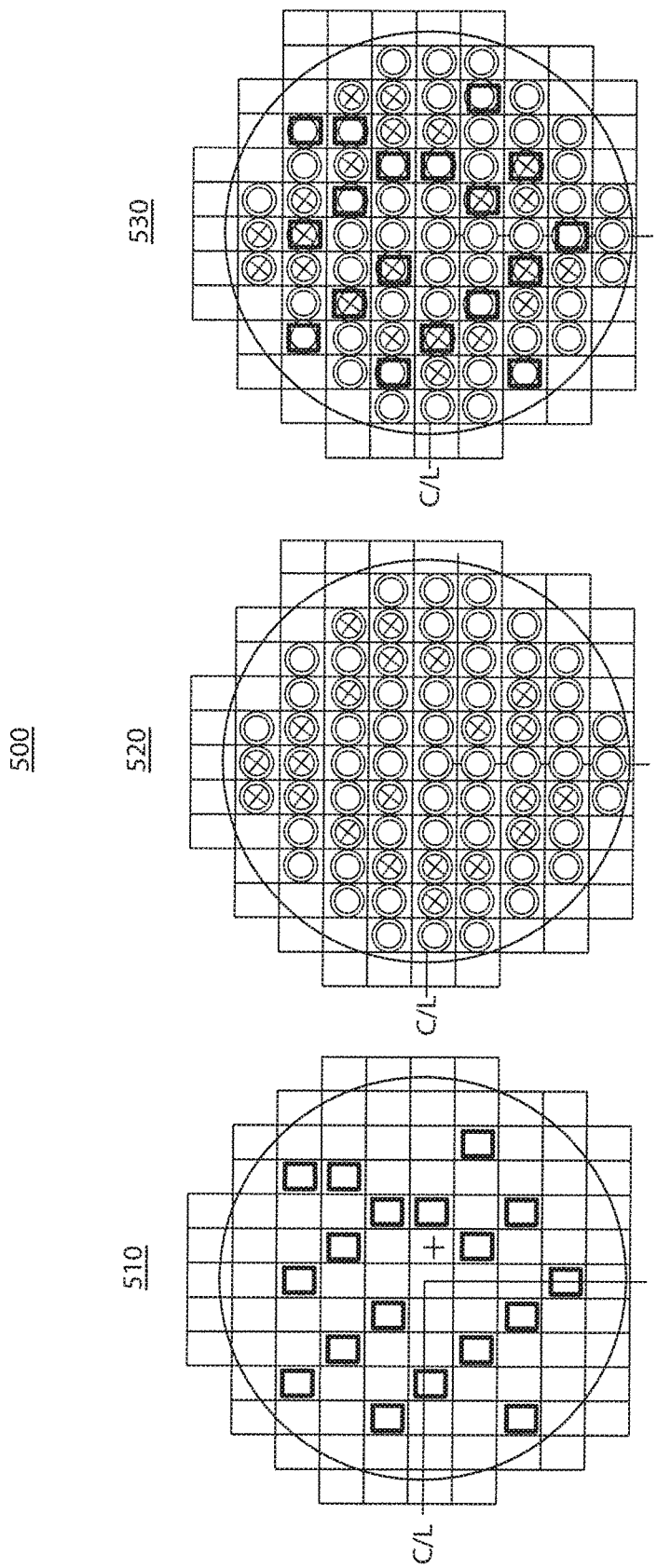
FIG. 5 is a diagram showing an example of the creation of a map for in-line wafer testing, in accordance with an embodiment of the present invention.

With reference to FIG. 5, a diagram 500 is provided illustrating the construction of a yield map. As shown, a predetermined die map 510 is laid over an actual yield on wafer map 520 to create a yield on test map 530. A circle corresponds to a confidence of device yield exceeding 80%, and an "x" corresponds to a confidence of device yield below 80%. In this illustrative embodiment, the actual yield on wafer corresponding to map 520 is 70%, while the yield on test corresponding to map 530 is about 38% (7/18 yielding).

Figure 6:
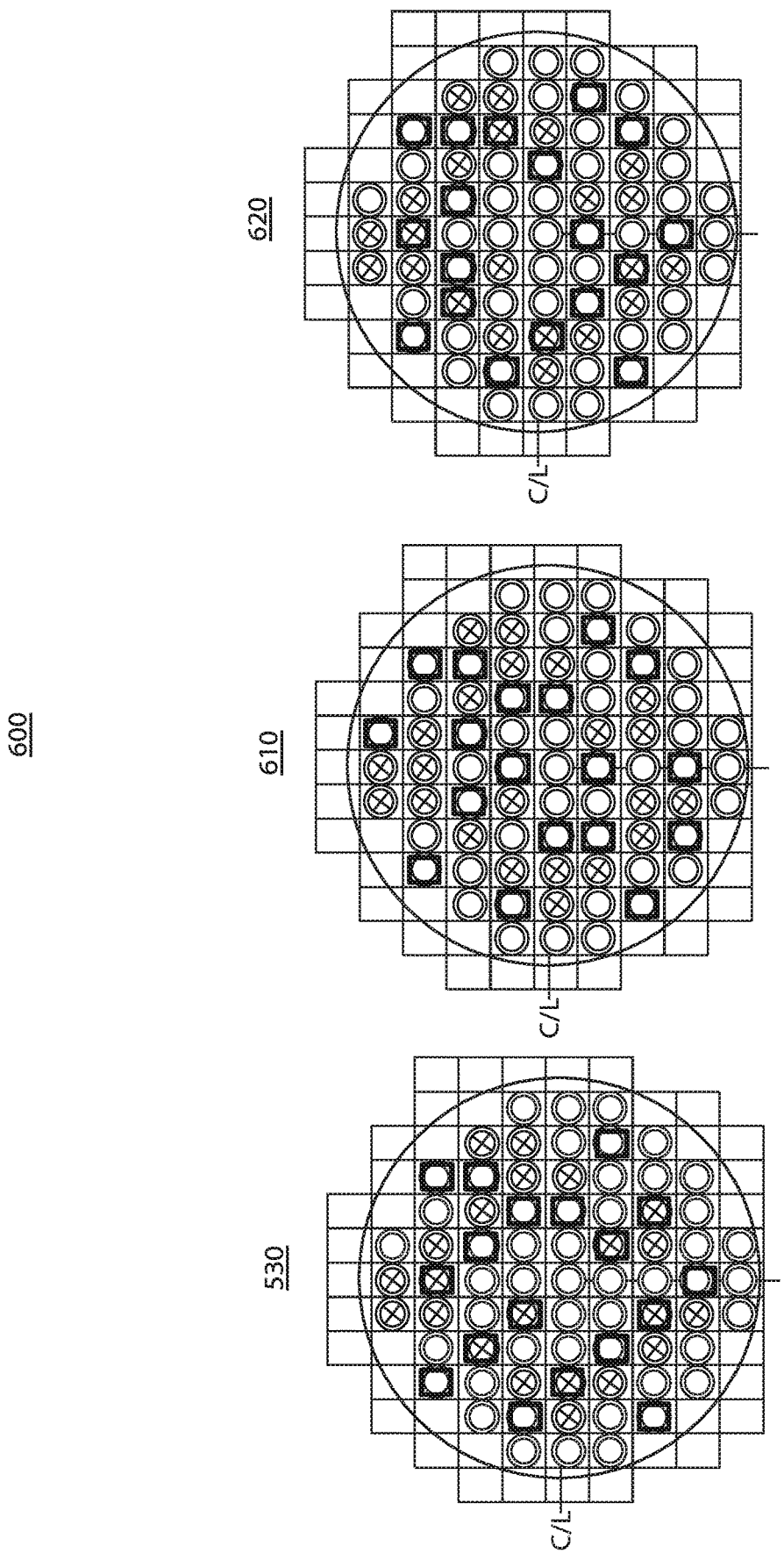
FIG. 6 is a diagram showing an example of a re-assignment of the map of FIG. 5, in accordance with an embodiment of the present invention.

With reference to FIG. 6, a diagram 600 is provided illustrating ILT map re-assignment applied to map 530 of FIG. 5, such as the re-assignment performed at block 424 described above with reference to FIG. 4. Two possible reassignment options corresponding to map 530, illustrated by map 610 and map 620, are shown in FIG. 6. Map 610 corresponds to the clean data (100% yielding device) re-assignment option, while map 620 corresponds to the resemble wafer yield map option.

As mentioned above with reference to FIG. 5, the actual yield on wafer corresponding to map 530 is 70% and the yield on test corresponding to map 530 is about 38% (7/18). In this example, the actual yield on wafer corresponding to map 610 is 70%, and the yield on test corresponding to map 610 is 100% (18/18). In this example, the actual yield on wafer corresponding to map 620 is 70%, and the yield on test corresponding to map 620 is about 72% (13/18).

As has been described herein above with reference to FIGS. 1-5, the embodiments described herein provide for systems and methods for in-line wafer testing using machine learning enhanced optical metrology to measure and characterize wafer structures, thereby improving wafer testing efficiency and reducing or eliminating bias results due to predetermined die maps. The embodiments described herein can solve various problems related to wafer testing, including wrong wafer testing statistics caused by static sampling regardless of wafer variation, by providing an effective fast screening process to control the sampling yielding and not yielding devices. For example, wafer sampling can be dynamically adjusted prior to the testing by employing a cognitive screening process. The cognitive screening process employing machine learning techniques can classify a chip as "good" or "defective" prior to testing, and an associated dynamic die selection process can be employed to reduce or eliminate bias with improved statistics. The embodiments described herein can provide for a high throughput (e.g., about 15 minutes for full wafer measurement) and non-destructive in-line metrology technique that has good precision (e.g., is sensitive to change in structure). The embodiments described herein can illustratively use a broadband light source such as, e.g., deep-ultraviolet to near-infrared (DUV-NIR), which can be sensitive to buried features and material properties.

Having described preferred embodiments of a semiconductor device and a method of in-line wafer testing using machine learning enhanced optical metrology (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A computer-implemented method for machine learning enhanced optical-based screening for in-line testing (ILT), comprising:
   receiving optical spectra data for a wafer-under-test (WUT) by performing scatterometry on the wafer-under-test;
   generating a yield map for device screening by performing predictive model screening by applying a predictive model that characterizes a defectiveness of devices to a full wafer map generated based on the received optical spectra data to obtain the device screening yield map with a confidence level for device screening;
   analyzing a plurality of devices associated with the wafer-under-test for defects based on the predictive model screening and identifying that a device associated with the WUT is defective or not based on the predictive model screening; and
   in response to determining that at least one of the plurality of devices is defective based on the analysis, dynamically modifying a yield map associated with the WUT to generate a modified yield map, including reassigning at least one die to address fixed sampling location by reassigning the at least one next die to at least one next die with a same distance from a center of the wafer-under-test.

2. The method of claim 1, further comprising training the predictive model based on data including raw optical spectra data and in-line wafer testing results.

3. The method of claim 2, wherein training the predictive model further includes using a two-class classification algorithm.

4. The method of claim 3, wherein training the predictive model further includes using logistic regression.

5. The method of claim 1, further comprising updating the predictive model based on the modified yield map.

6. The method of claim 1, wherein dynamically modifying the yield map further includes reassigning the at least one die to at least one next die of the wafer-under-test.

7. The method of claim 1, further comprising performing full in-line testing on the wafer-under test based on the modified yield map.

8. A system for machine learning enhanced optical-based screening for in-line wafer testing, comprising:
   a memory device for storing program code; and
   at least one processor operatively coupled to the memory device and configured to execute program code stored on the memory device to:
     receive optical spectra data for a wafer-under-test (WUT) by performing scatterometry on the wafer-under-test;
     generate a yield map for device screening by performing predictive model screening by applying a predictive model that characterizes a defectiveness of devices to a full wafer map generated based on the received optical spectra data to obtain the device screening yield map with a confidence level for device screening;
     analyze a plurality of devices associated with the wafer-under-test for defects based on the predictive model screening and identify that a device associated with the WUT is defective or not based on the predictive model screening; and in response to determining that at least one of the plurality of devices is defective based on the analysis, dynamically modify a yield map associated with the WUT to generate a modified yield map by reassigning at least one die to address fixed sampling location by reassigning the at least one next die to at least one next die with a same distance from a center of the wafer-under-test.

9. The system of claim 8, wherein the at least one processor is further configured to execute program code stored on the memory device to train the predictive model based on data including raw optical spectra data and in-line wafer testing results.

10. The system of claim 9, wherein the at least one processor device is further configured to train the predictive model by using a two-class classification algorithm.

11. The system of claim 10, wherein the at least one processor device is further configured to train the predictive model by using logistic regression.

12. The system of claim 8, wherein the at least one processor is further configured to execute program code stored on the memory device to update the predictive model based on the modified yield map.

13. The system of claim 8, wherein the at least one processor device is further configured to execute program code stored on the memory device to perform full in-line testing on the wafer-under test based on the modified yield map.

14. A computer program product comprising a non transitory computer readable storage medium having program instructions embodied therewith, the program instructions executable by a computer to cause the computer to perform a method for machine learning enhanced optical-based screening for in-line wafer testing, the method performed by the computer comprising:

receiving optical spectra data for a wafer-under-test (WUT) by performing scatterometry on the wafer-under-test;

generating a yield map for device screening by performing predictive model screening by applying a predictive model that characterizes a defectiveness of devices to a full wafer map generated based on the received optical spectra data to obtain the device screening yield map with a confidence level for device screening;

analyzing a plurality of devices associated with the wafer-under-test for defects based on the predictive model screening and identifying that a device associated with the WUT is defective or not based on the predictive model screening; and in response to determining that at least one of the plurality of devices is defective, dynamically modifying a yield map to generate a modified yield map, including reassigning at least one die to address fixed sampling location by reassigning the at least one next die to at least one next die with a same distance from a center of the wafer-under-test.

15. The computer program product of claim 14, wherein the method performed by the computer further includes training the predictive model based on data including raw optical spectra data and in-line wafer testing results.

16. The computer program product of claim 15, wherein training the predictive model further includes using a two-class classification algorithm or logistic regression.

17. The computer program product of claim 14, wherein the method performed by the computer further includes updating the predictive model based on the modified yield map.

18. The computer program product of claim 14, wherein the method performed by the computer further includes performing full in-line testing on the wafer-under test based on the modified yield map.

* * * * *